(12) United States Patent
Kito et al.

(10) Patent No.: US 7,859,066 B2
(45) Date of Patent: Dec. 28, 2010

(54) NONVOLATILE SEMICONDUCTOR MEMORY DEVICE AND METHOD OF MANUFACTURING THE SAME

(75) Inventors: Masaru Kito, Yokohama (JP); Hideaki Aochi, Kawasaki (JP); Ryota Katsumata, Yokohama (JP); Masaru Kidoh, Komae (JP); Hiroyasu Tanaka, Tokyo (JP); Yoshiaki Fukuzumi, Yokohama (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 12/140,734

(22) Filed: Jun. 17, 2008

(65) Prior Publication Data

US 2008/0315291 A1    Dec. 25, 2008

(30) Foreign Application Priority Data

Jun. 20, 2007    (JP) .............................. 2007-163039

(51) Int. Cl.
*H01L 21/8247* (2006.01)
(52) U.S. Cl. .............................. 257/411; 257/E29.309; 257/E27.103; 257/E21.18
(58) Field of Classification Search ................. 438/387, 438/FOR. 189, 27; 257/411, E29.309, E27.103, 257/E21.18
See application file for complete search history.

(56) References Cited

U.S. PATENT DOCUMENTS

| | | | | |
|---|---|---|---|---|
| 5,229,312 A | * | 7/1993 | Mukherjee et al. | .......... 438/259 |
| 5,599,724 A | | 2/1997 | Yoshida | |
| 5,707,885 A | * | 1/1998 | Lim | ............................ 438/155 |
| 6,448,607 B1 | * | 9/2002 | Hsu et al. | .................... 257/315 |
| 6,548,374 B2 | * | 4/2003 | Chung | ......................... 438/424 |
| 6,661,053 B2 | * | 12/2003 | Willer et al. | ................. 257/329 |
| 6,699,759 B2 | * | 3/2004 | Lai | ............................. 438/275 |
| 6,808,987 B2 | * | 10/2004 | Hsiao et al. | ................. 438/257 |
| 7,205,195 B2 | * | 4/2007 | Kleint et al. | ................. 438/259 |
| 7,274,069 B2 | * | 9/2007 | Deppe et al. | ................. 257/330 |
| 7,292,478 B2 | * | 11/2007 | Yu et al. | ................. 365/185.28 |
| 7,323,388 B2 | * | 1/2008 | Deppe et al. | ................. 438/270 |
| 7,344,923 B2 | * | 3/2008 | Hofmann et al. | ............ 438/128 |
| 7,354,829 B2 | * | 4/2008 | Aoki et al. | ................... 438/272 |

(Continued)

FOREIGN PATENT DOCUMENTS

JP      51-69986      6/1976

(Continued)

OTHER PUBLICATIONS

U.S. Appl. No. 11/896,261, filed Aug. 30, 2007, Ryota Katsumata.

(Continued)

*Primary Examiner*—George Fourson
(74) *Attorney, Agent, or Firm*—Oblon, Spivak, McClelland, Maier & Neustadt, L.L.P.

(57) ABSTRACT

A nonvolatile semiconductor memory device has a plurality of memory strings each including a plurality of electrically rewritable memory cells serially connected. The memory string includes a columnar semiconductor portion extending in the vertical direction from a substrate, a first charge storage layer formed adjacent to the columnar semiconductor portion and configured to accumulate charge, a first block insulator formed adjacent to the first charge storage layer, and a first conductor formed adjacent to the first block insulator.

12 Claims, 14 Drawing Sheets

U.S. PATENT DOCUMENTS

| | | | |
|---|---|---|---|
| 2006/0157753 A1* | 7/2006 | Kim et al. | 257/288 |
| 2007/0190725 A1* | 8/2007 | Kim et al. | 438/261 |
| 2007/0252201 A1 | 11/2007 | Kito et al. | |
| 2008/0048245 A1 | 2/2008 | Kito et al. | |
| 2008/0099819 A1 | 5/2008 | Kito et al. | |
| 2009/0251973 A1* | 10/2009 | Satoh | 365/185.29 |
| 2010/0038701 A1* | 2/2010 | Bhattacharyya | 257/324 |
| 2010/0072539 A1* | 3/2010 | Yasuda | 257/326 |

FOREIGN PATENT DOCUMENTS

| | | |
|---|---|---|
| JP | 64-017478 | 1/1989 |
| JP | 5-243262 | 9/1993 |
| JP | 10-093083 | 4/1998 |
| JP | 2003-78044 | 3/2003 |
| JP | 3566944 | 6/2004 |
| JP | 2005-244009 | 9/2005 |
| JP | 2006-229233 | 8/2006 |
| KR | 10-0674952 | 8/2006 |
| KR | 10-0684900 | 10/2006 |
| KR | 10-0672829 | 1/2007 |

OTHER PUBLICATIONS

U.S. Appl. No. 11/955,900, filed Dec. 13, 2007, Ryota Katsumata, et al.

* cited by examiner

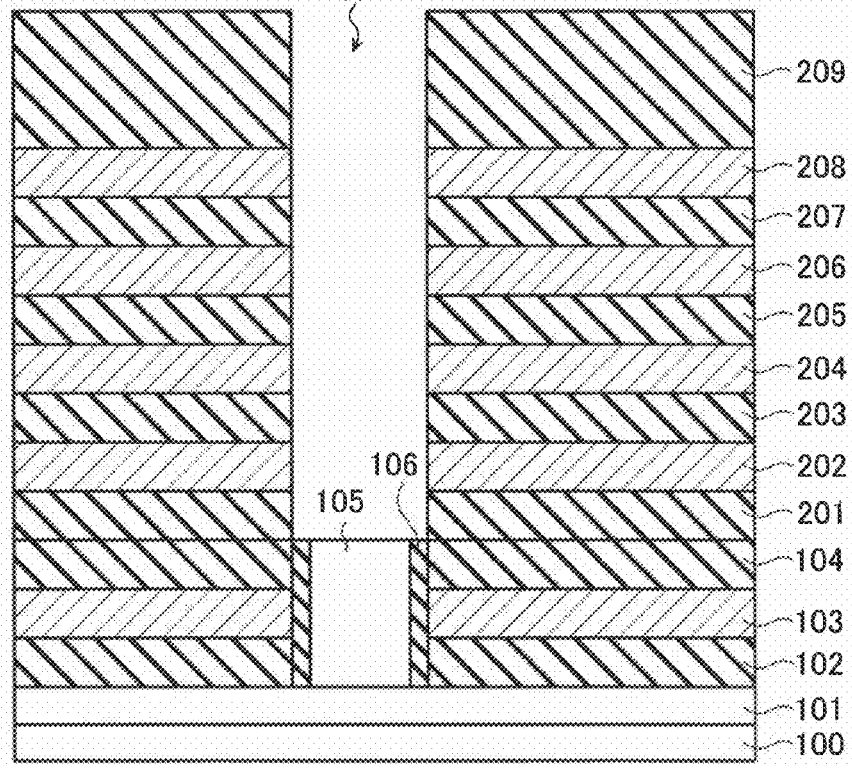
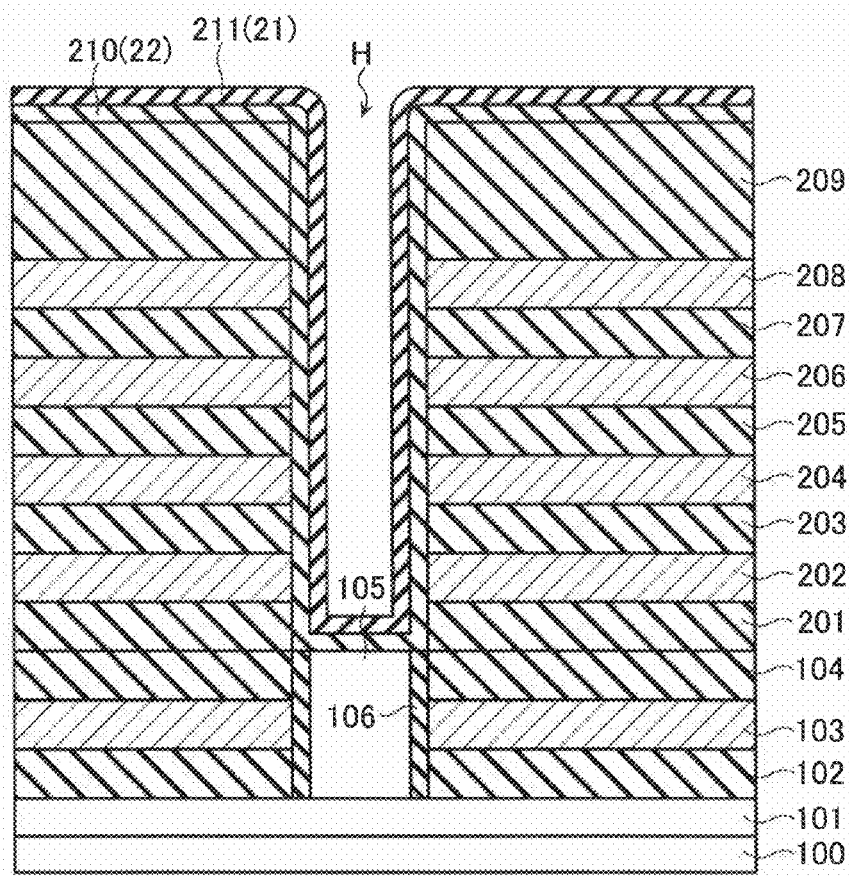

NONVOLATILE SEMICONDUCTOR MEMORY DEVICE AND METHOD OF MANUFACTURING THE SAME

CROSS-REFERENCE TO RELATED APPLICATION

This application is based upon and claims the benefit of priority from the prior Japanese Patent Application No. 2007-163039, filed on Jun. 20, 2007, the entire contents of which are incorporated herein by reference.

BACKGROUND OF THE INVENTION

1. Field of the Invention

The present invention relates to an electrically rewritable semiconductor memory device. More particularly, it relates to a nonvolatile semiconductor memory device among semiconductor memory devices, and a method of manufacturing the same.

2. Description of the Related Art

Conventionally, an LSI is formed of elements integrated in a two-dimensional plane on a silicon substrate. An increase in storage capacity of a memory absolutely requires downsizing the dimensions of one element (fine pattering) though the fine pattering has been made difficult from the cost and technology in recent years. Fine pattering requires technological improvements in photolithography though the current ArF liquid immersion lithography has a resolution limit, for example, in a rule near 40 nm. Accordingly, much finer pattering requires the introduction of an EUV exposure. The EUV exposure is expensive, however, and not practical in consideration of the cost. Even if fine pattering can be achieved, it is expected to reach physical limits such as the breakdown voltage between elements unless the drive voltage and so forth are scaled. In a word, there is a high possibility of making the device difficult to operate.

In recent years, for the purpose of increasing the degree of memory integration, many semiconductor memory devices including memory cells arranged three-dimensionally have been proposed (see Patent Document 1: JP2003-078044A, Patent Document 2: U.S. Pat. No. 5,599,724, and Patent Document 3: U.S. Pat. No. 5,707,885).

One of the conventional semiconductor memory devices including memory cells arranged three-dimensionally is a semiconductor memory device using SGT (columnar)-structured transistors (see Patent Documents 1-3). The semiconductor memory device using SGT (columnar)-structured transistors includes multiple layers of polysilicon serving as gate electrodes, and a columnar semiconductor portion in the shape of a pillar formed through the multiple layers of polysilicon. The columnar semiconductor portion serves as a channel (body) portion in the transistor. Plural insulated charge storage layers are provided around the columnar semiconductor portion to accumulate charge. The configuration including the polysilicon, the columnar semiconductor portion and the charge storage layer is called a memory string.

SUMMARY OF THE INVENTION

In an aspect the present invention provides a nonvolatile semiconductor memory device having a plurality of memory strings each including a plurality of electrically rewritable memory cells serially connected, the memory string including a columnar semiconductor portion extending in the vertical direction from a substrate, a first charge storage layer formed adjacent to the columnar semiconductor portion and configured to accumulate charge, a first block insulator formed adjacent to the first charge storage layer, and a first conductor formed adjacent to the first block insulator.

In another aspect the present invention provides a nonvolatile semiconductor memory device having a plurality of memory strings each including a plurality of electrically rewritable memory cells serially connected, the memory string including a columnar semiconductor portion extending in the vertical direction from a substrate, a top insulator formed adjacent to the columnar semiconductor portion, a barrier insulator formed adjacent to the top insulator, a second charge storage layer formed adjacent to the barrier insulator and configured to accumulate charge, a second block insulator formed adjacent to the second charge storage layer, and a first conductor formed adjacent to the second block insulator.

In an aspect the present invention provides a method of manufacturing a nonvolatile semiconductor memory device having a plurality of memory strings each including a plurality of electrically rewritable memory cells serially connected, the method comprising: forming a first conductor extending in parallel with a substrate and stacked in layers on the substrate; forming a penetrated hole through layers of the first conductor; forming a first block insulator on a side of the first conductor facing the penetrated hole; forming a first charge storage layer configured to accumulate charge and located adjacent to the first block insulator; and forming a columnar semiconductor portion extending in the vertical direction from the substrate and located adjacent to a side of the first charge storage layer inside the penetrated hole.

In another aspect the present invention provides a method of manufacturing a nonvolatile semiconductor memory device having a plurality of memory strings each including a plurality of electrically rewritable memory cells serially connected, the method comprising: forming a first conductor extending in parallel with a substrate and stacked in layers on the substrate; forming a penetrated hole through layers of the first conductor; forming a second block insulator on a side of the conductor facing the penetrated hole; forming a second charge storage layer configured to accumulate charge and located adjacent to a side of the second block insulator; forming a barrier insulator adjacent to a side of the second charge storage layer; forming a top insulator adjacent to a side of the barrier insulator; and forming a columnar semiconductor portion extending in the vertical direction from the substrate and located adjacent to a side of the top insulator inside the penetrated hole.

BRIEF DESCRIPTION OF THE DRAWINGS

FIG. 9 is a cross-sectional view showing a process step of manufacturing the columnar semiconductor portion CLmn, the trap film 21 and the block insulator 22 in the nonvolatile semiconductor memory device 10 according to the first embodiment of the present invention.

FIG. 10 is a cross-sectional view showing a process step of manufacturing the columnar semiconductor portion CLmn, the trap film 21 and the block insulator 22 in the nonvolatile semiconductor memory device 10 according to the first embodiment of the present invention.

DETAILED DESCRIPTION OF THE EMBODIMENTS

With reference to the drawings, one embodiment associated with a nonvolatile semiconductor memory device according to the present invention will now be described.

First Embodiment

Configuration of First Embodiment

Figure 1:
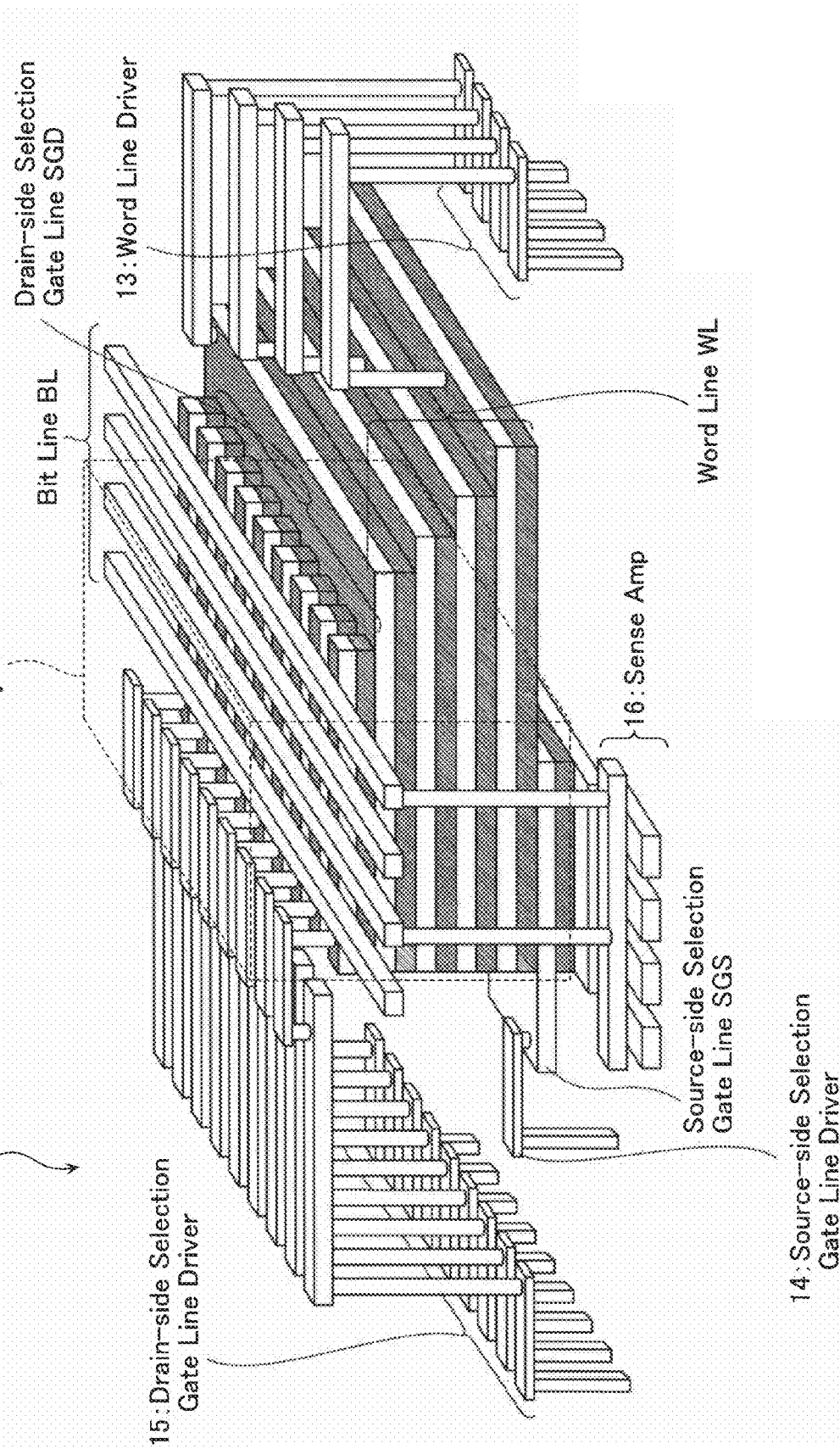
FIG. 1 is a schematic diagram of a nonvolatile semiconductor memory device according to a first embodiment of the present invention.

FIG. 1 shows a schematic diagram of a nonvolatile semiconductor memory device according to a first embodiment of the present invention. As shown in FIG. 1, the nonvolatile semiconductor memory device 10 according to the first embodiment mainly comprises a memory transistor area 12, a word line driver 13, a source-side selection gate line (SGS) driver 14, a drain-side selection gate line (SGD) driver 15, and a sense amp 16. The memory transistor area 12 includes memory transistors operative to store data. The word line driver 13 controls the voltage applied to the word line WL. The source-side selection gate line (SGS) driver 14 controls the voltage applied to a source-side selection gate line SGS. The drain-side selection gate line (SGD) driver 15 controls the voltage applied to a drain-side selection gate line (SGD). The sense amp 16 amplifies the potential read out of a memory transistor. In addition, the nonvolatile semiconductor memory device 10 according to the first embodiment comprises a bit line driver configured to control the voltage applied to a bit line BL, and a source line driver configured to control the voltage applied to a source line SL (not shown).

As shown in FIG. 1, in the nonvolatile semiconductor memory device 10 according to the first embodiment, the memory transistors contained in the memory transistor area 12 are formed of semiconductor layers stacked plural. As shown in FIG. 1, a word line (first conductor) WL in each layer spreads two-dimensionally within a certain region. The word line WL in each layer has a flat structure formed in a respective identical layer, which is a plate-like flat structure.

Figure 2:
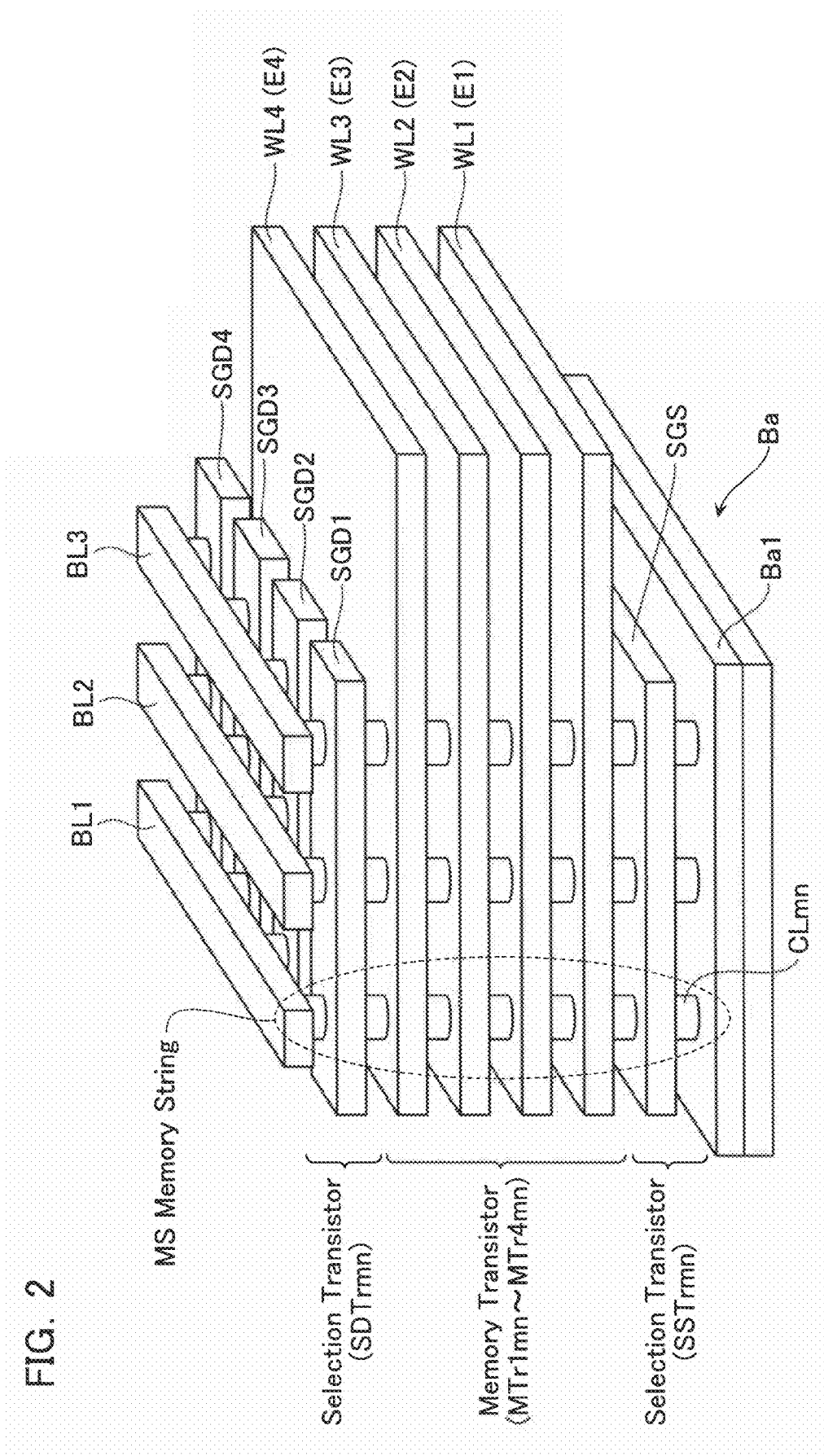
FIG. 2 is a partial brief perspective view of a memory transistor area 12 in the nonvolatile semiconductor memory device according to the first embodiment of the present invention.

FIG. 2 is a partial brief perspective view of the memory transistor area 12 in the nonvolatile semiconductor memory device 10 according to the first embodiment. In the first embodiment the memory transistor area 12 includes m×n pieces (m and n denote natural numbers) of memory strings MS each composed of memory transistors MTr1$mn$-MTr4$mn$ and selection transistors SSTrmn and SDTrmn. FIG. 2 shows an example with m=3 and n=4.

Memory transistors MTr1mn-MTr4mn in each memory string have respective gates connected to word lines WL1-WL4, which are formed of respective identical conductors, respectively in common. Namely, the gates of the memory transistors MTr1mn in the memory strings MS are all connected to the word line WL1. The gates of the memory transistors MTr2mn in the memory strings MS are all connected to the word line WL2. The gates of the memory transistors MTr3mn in the memory strings MS are all connected to the word line WL3. The gates of the memory transistors MTr4mn in the memory strings MS are all connected to the word line WL4. In the nonvolatile semiconductor memory device 10 according to the first embodiment, as shown in FIGS. 1 and 2, the word lines WL1-WL4 spread two-dimensionally and have a respective plate-like flat structure. The word lines WL1-WL4 are arranged almost vertical to the memory strings MS, respectively.

The memory strings MS include respective columnar semiconductor portions CLmn in the form of columns on an $n^+$-region formed in a P-well region Ba1 on a semiconductor substrate Ba (m=1-3, n=1-4 in the example shown in FIG. 2). The columnar semiconductor portions CLmn are formed in the vertical direction from the semiconductor substrate Ba and arranged in matrix on the semiconductor substrate Ba and the planes of the word lines WL1-WL4. In a word, the memory strings are also arranged in matrix in a plane normal to the columnar semiconductor portions CLmn. The columnar semiconductor portions CLmn may be in the shape of cylinders or prisms. The columnar semiconductor portions CLmn may include semiconductor portions in the form of stepped columns.

As shown in FIG. 2, there are provided drain-side selection gate lines (second conductor) SGD in the form of rectangular plates (SGD1-SGD4 in the example shown in FIG. 2) above the memory strings MS. They adjoin the columnar semiconductor portions CLmn via a first gate insulator (denoted with the reference numeral "216" as described later) to configure the drain-side selection transistors SDTrmn. The drain-side selection gate lines SGD are isolated from each other and formed in the shape of stripes in parallel with the semiconductor substrate Ba. At the center of the width of the drain-side selection gate line SGD, there is provided a columnar semiconductor portion CLmn formed through the center.

In other words, the drain-side selection gate line SGD is configured such that the first insulator (216) adjoins the columnar semiconductor portion CLmn and locates above a later-described trap film (charge storage layer) 21. The drain-side selection gate line SGD adjoins the first insulator (216) and locates above the word lines WL1-WL4. The drain-side selection gate line SGD serves as a control gate of the drain-side selection transistor SDTrmn operative to control the current flow in a memory cell.

As shown in FIG. 2, there are provided source-side selection gate lines (third conductor) SGS beneath the memory strings MS. They adjoin the columnar semiconductor portions CLmn via a second gate insulator (denoted with the reference numeral "106" as described later). The source-side selection gate lines SGS are structured in the shape of flat plates that spread two-dimensionally.

In other words, the source-side selection gate line SGS is configured such that the second insulator (106) adjoins the columnar semiconductor portion CLmn and locates beneath the later-described trap film (charge storage layer) 21. The source-side selection gate line SGS adjoins the second insulator (106) and locates beneath the word lines WL1-WL4. The source-side selection gate line SGS serves as a control gate of the source-side selection transistor SSTrmn operative to control the current flow in a memory cell.

Figure 3:
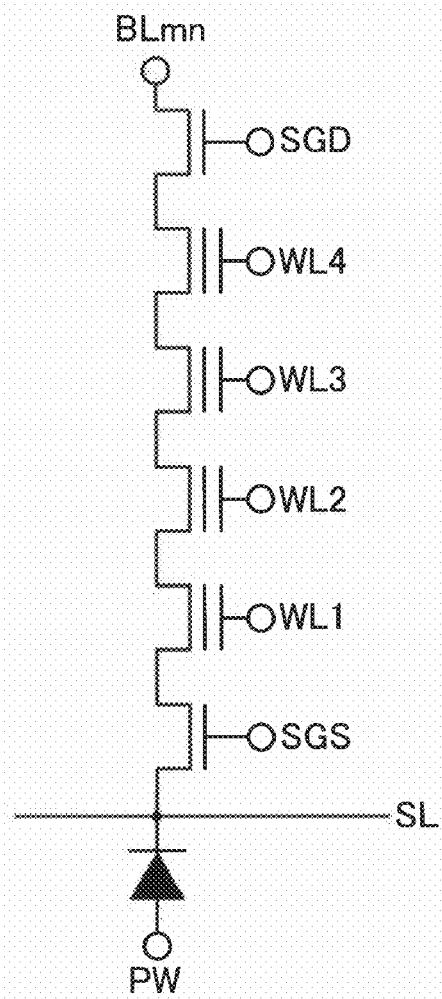
FIG. 3 is a circuit diagram of one memory string MS in the first embodiment of the present invention.
Figure 4:
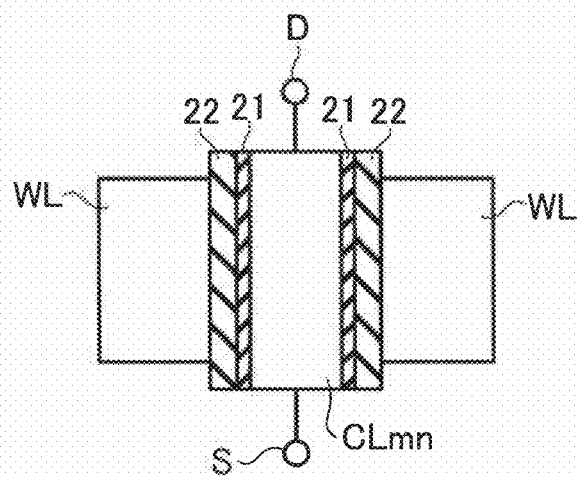
FIG. 4 is a structural cross-sectional view of one memory transistor MTrmn in the first embodiment of the present invention.

Referring to FIGS. 2-4, the circuitry and operation of a circuit including the memory string MS in the first embodiment will be described. FIG. 3 is a circuit diagram of one memory string MS in the first embodiment. FIG. 4 is a structural cross-sectional view of one memory transistor MTrmn in the first embodiment.

As shown in FIGS. 2 and 3, in the first embodiment, the memory string MS includes four memory transistors MTr1mn-MTr4mn and two selection transistors SSTrm and SDTrmn. These four memory cell transistors MTr1mn-MTr4mn and the source-side selection transistor SSTrm and the drain-side selection transistor SDTrmn are connected in series (see FIG. 3). In the memory string MS of the first embodiment, the columnar semiconductor portion CLmn is formed on the $N^+$-region formed in the $P^-$-type region (P-well region) Ba1 on the semiconductor substrate Ba.

As shown in FIG. 4, a trap film 21 and a block insulator 22 formed in turn around the columnar semiconductor portion CLmn, together with the word lines WL1-WL4 formed around them, form plural plate-like electrodes E1-E4. The electrodes E1-E4, the trap film 21 and the block insulator 22, together with the columnar semiconductor portion CLmn, form the memory transistors MTr1mn-MTr4mn. The detailed structure of the trap film 21 and the block insulator 22 is described later with the use of FIG. 5. The selection transistor SSTrmn has a source connected to a source line SL (the $n^+$-region formed in the P-well region Ba1 on the semiconductor substrate Ba). The selection transistor SDTrmn has a drain connected to a bit line BL.

In a word, in one memory transistor MTrmn, the word line (conductor) WL surrounding the columnar semiconductor portion CLmn with the inclusion of the trap film 21 and the block insulator 22 serves as a control gate electrode CG. The source S and the drain D of the memory transistor MTrmn are formed on the columnar semiconductor portion CLmn.

In the nonvolatile semiconductor memory device configured as above, the voltages on the bit lines BL1-BL3, the drain-side selection gate lines SGD, the word lines WL1-WL4, the source-side selection gate lines SGS, and the source line SL can be controlled by the bit line driver (not shown), the drain-side selection gate driver 15, the word line driver 13, the source-side selection gate line driver 14, and the source line driver (not shown). Namely, controlling charge in the charge storage layer in a certain memory transistor MTrmn makes it possible to read, write and erase data.

Figure 5:
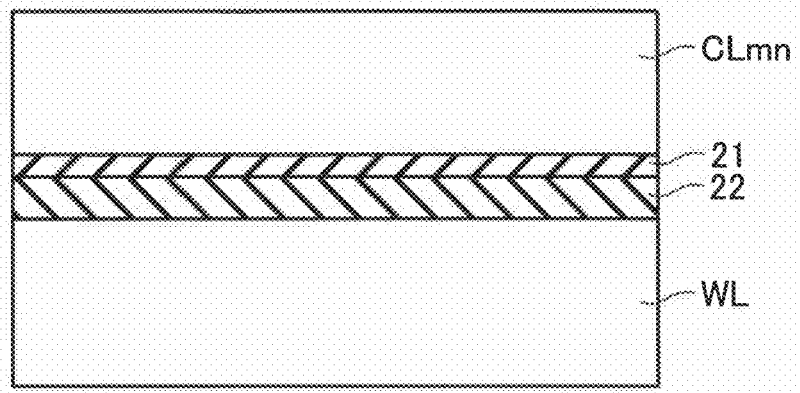
FIG. 5 is a conceptual view showing a structure of layers between a columnar semiconductor portion CLmn and a word line WL in the first embodiment of the present invention.

Referring next to FIG. 5, the configuration between the columnar semiconductor portion CLmn and the word line WL in the first embodiment is described. FIG. 5 is a conceptual view showing a structure of layers between the columnar semiconductor portion CLmn and the word line WL in the first embodiment.

As shown in FIG. 5, one memory transistor MTrmn comprises a columnar semiconductor portion CLmn; a trap film 21 formed adjacent to the columnar semiconductor portion CLmn and operative to serve as a charge storage layer; a block insulator 22 formed adjacent to the trap film 21; and a word line WL adjacent to the block insulator 22. In this example, the trap film 21 (charge storage layer) is composed of a silicon nitride (SiN) while the block insulator 22 is composed of a silicon oxide ($SiO_2$). The columnar semiconductor portion CLmn is composed of polysilicon (semiconductor) while the word line WL is composed of a conductor.

In a word, the memory transistor MTrmn has a SONS (Semiconductor-Oxide-Nitride-Semiconductor) structure, which includes Conductor, SiO₂, SiN and Semiconductor formed from the word line WL to the columnar semiconductor portion CLmn in turn.

Figure 6:
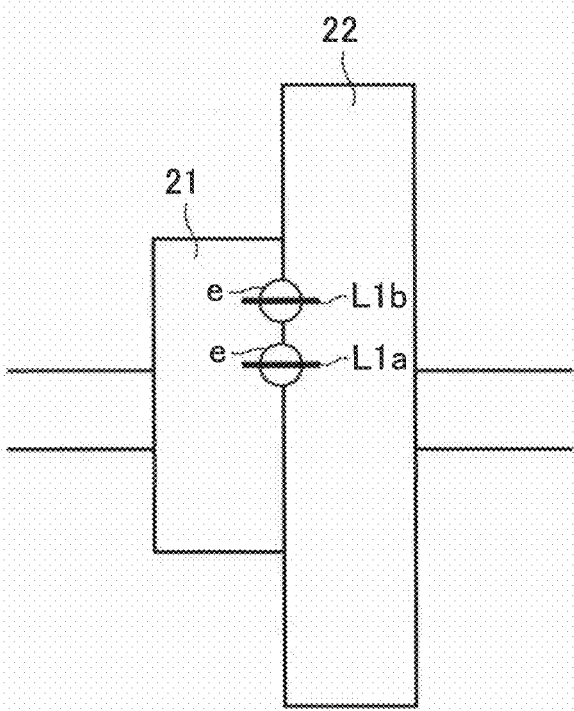
FIG. 6 briefly shows energy bands caused by a trap film 21 and a block insulator 22 in the first embodiment of the present invention.

FIG. 6 briefly shows energy bands caused by the trap film 21 and the block insulator 22 in the first embodiment. Charge e is accumulated (trapped) in energy levels L1a, L1b at the interface between the trap film (SiN) 21 and the block insulator (SiO₂) 22.

(Method of Manufacturing Columnar Semiconductor Portion CLmn and Charge Storage Layer 20 in First Embodiment)

Referring next to FIGS. 7-16, a method of manufacturing the columnar semiconductor portion CLmn, the trap film 21 and the block insulator 22 in the nonvolatile semiconductor memory device 10 according to the first embodiment is described.

Figure 7:
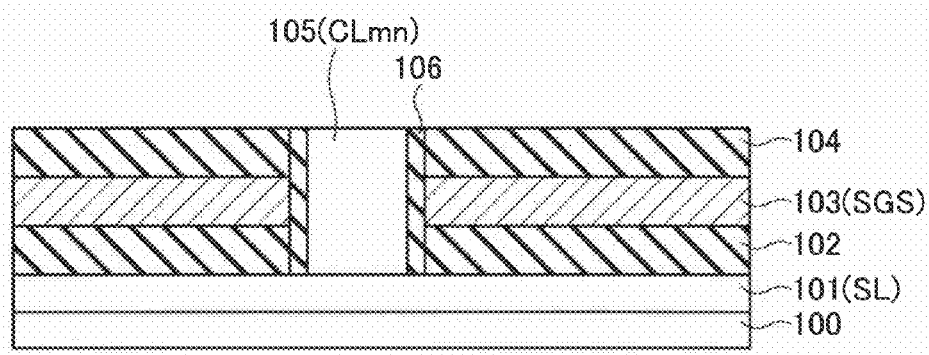
FIG. 7 is a cross-sectional view showing a process step of manufacturing the columnar semiconductor portion CLmn, the trap film 21 and the block insulator 22 in the nonvolatile semiconductor memory device 10 according to the first embodiment of the present invention.

First, as shown in FIG. 7, an initial structure including the source line SL and the source selection gate line SGS is formed. The initial structure includes, on the surface of a semiconductor substrate (Si) 100, a source line diffused layer 101 to be turned into the source line SL. It further includes, on the source line diffused layer 101, an interlayer insulator 102, a conductor (third conductor) 103 to be turned into the source selection gate line SGS, and an interlayer insulator 104 in turn. The initial structure also includes a polysilicon layer 105 formed through the interlayer insulator 104, the conductor 103 and the interlayer insulator 102 to the surface of the source line diffused layer 101. The polysilicon layer 105 is to be turned into the columnar semiconductor portion CLmn. A gate insulator (second gate insulator) 106 is formed between the polysilicon layer 105 and each of the interlayer insulator 104, the conductor 103 and the interlayer insulator 102.

Figure 8:
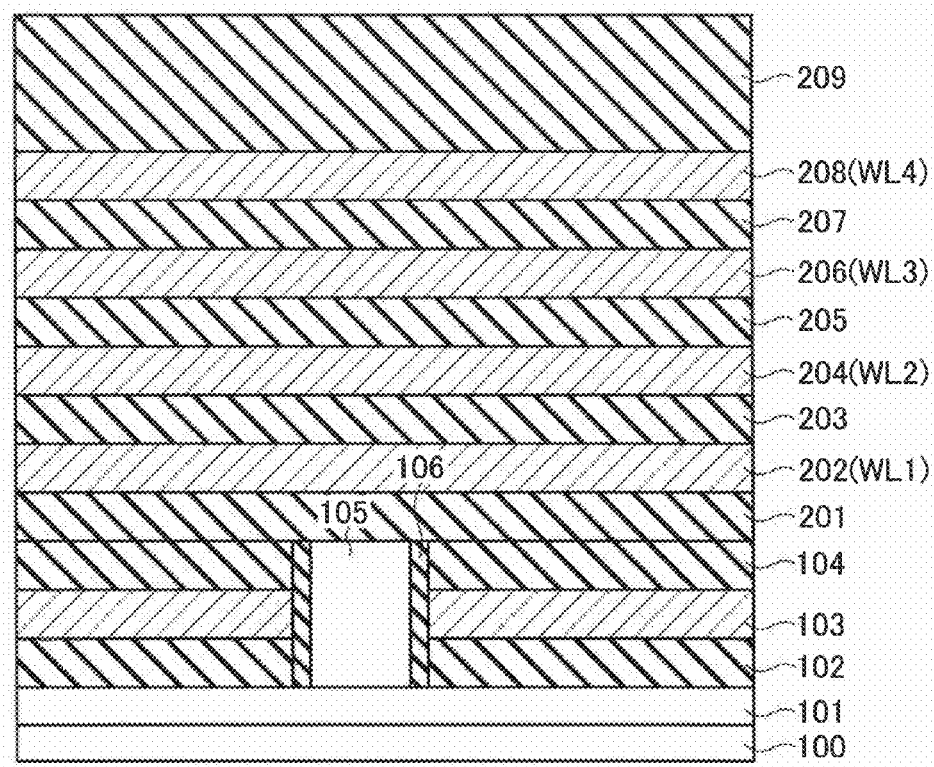
FIG. 8 is a cross-sectional view showing a process step of manufacturing the columnar semiconductor portion CLmn, the trap film 21 and the block insulator 22 in the nonvolatile semiconductor memory device 10 according to the first embodiment of the present invention.

Subsequently, as shown in FIG. 8, on the interlayer insulator 104, the polysilicon layer 105 and the gate insulator 106, an interlayer insulator 201, a conductor 202, an interlayer insulator 203, a conductor 204, an interlayer insulator 205, a conductor 206, an interlayer insulator 207, a conductor 208, and an interlayer insulator 209 are deposited in turn. In a word, the conductors (first conductors) 202, 204, 206, 208 extending in parallel with the semiconductor substrate Ba are formed as stacked in layers on the semiconductor substrate Ba. The conductors 202, 204, 206, 208 are to be turned into the word lines WL1, WL2, WL3, WL4.

Subsequently, as shown in FIG. 9, a penetrated hole (plug hole) H is formed through the conductors 202, 204, 206, 208 from the interlayer insulator 209 to the surface of the polysilicon layer 105 (columnar semiconductor portion CLmn).

Then, a TEOS film (high-temperature oxidized film) 210 to be turned into the block insulator 22 is deposited. For example, the TEOS film 210 is controlled to have a thickness of 7 nm. Thereafter, defy-annealing is applied to deposit a silicon nitride 211 to be turned into the trap film (charge storage layer) 21 as shown in FIG. 10. For example, the defy-annealing includes exposing it to an ambient of nitrogen (N₂) at 800° C. for 10 minutes, thereby depositing the silicon nitride 211 with a thickness of 10 nm.

Figure 11:
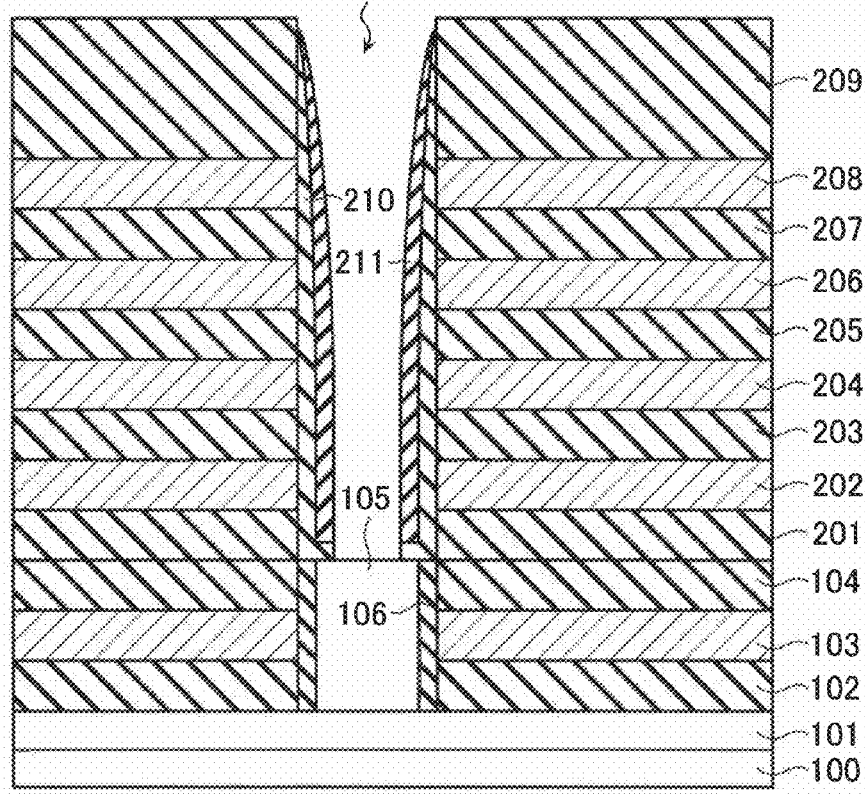
FIG. 11 is a cross-sectional view showing a process step of manufacturing the columnar semiconductor portion CLmn, the trap film 21 and the block insulator 22 in the nonvolatile semiconductor memory device 10 according to the first embodiment of the present invention.

Next, as shown in FIG. 11, an anisotropic etching by RIE is used to remove the silicon nitride 211 and the TEOS film 210 formed on the bottom (region P1) of the penetrated hole H. Through the step in FIG. 11, the polysilicon layer (columnar semiconductor portion) 105 is exposed, and a native oxide 105a is formed over the surface of the polysilicon layer 105 as shown in FIG. 12.

Figure 12:
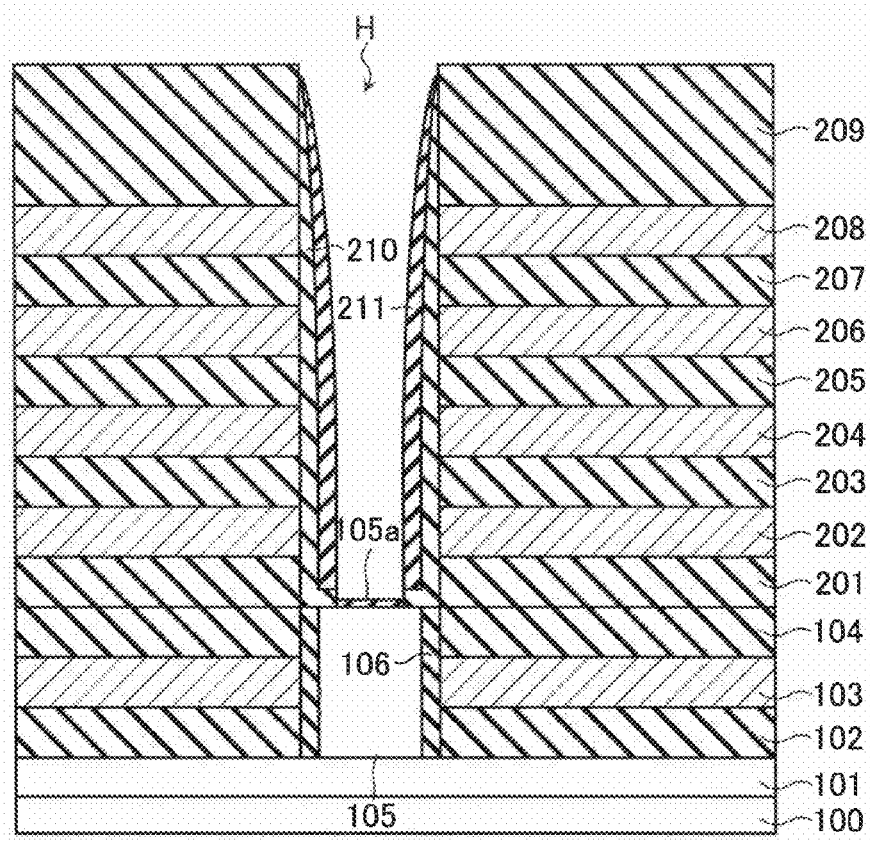
FIG. 12 is a cross-sectional view showing a process step of manufacturing the columnar semiconductor portion CLmn, the trap film 21 and the block insulator 22 in the nonvolatile semiconductor memory device 10 according to the first embodiment of the present invention.

Through the steps in FIGS. 10-12, the TEOS film 210 (block insulator 22) is formed on sides of the conductors 202, 204, 206, 208 facing the penetrated hole H. In addition, the silicon nitride 211 (trap film 21) is formed adjacent to sides of the TEOS film 210 (block insulator 22).

Figure 13:
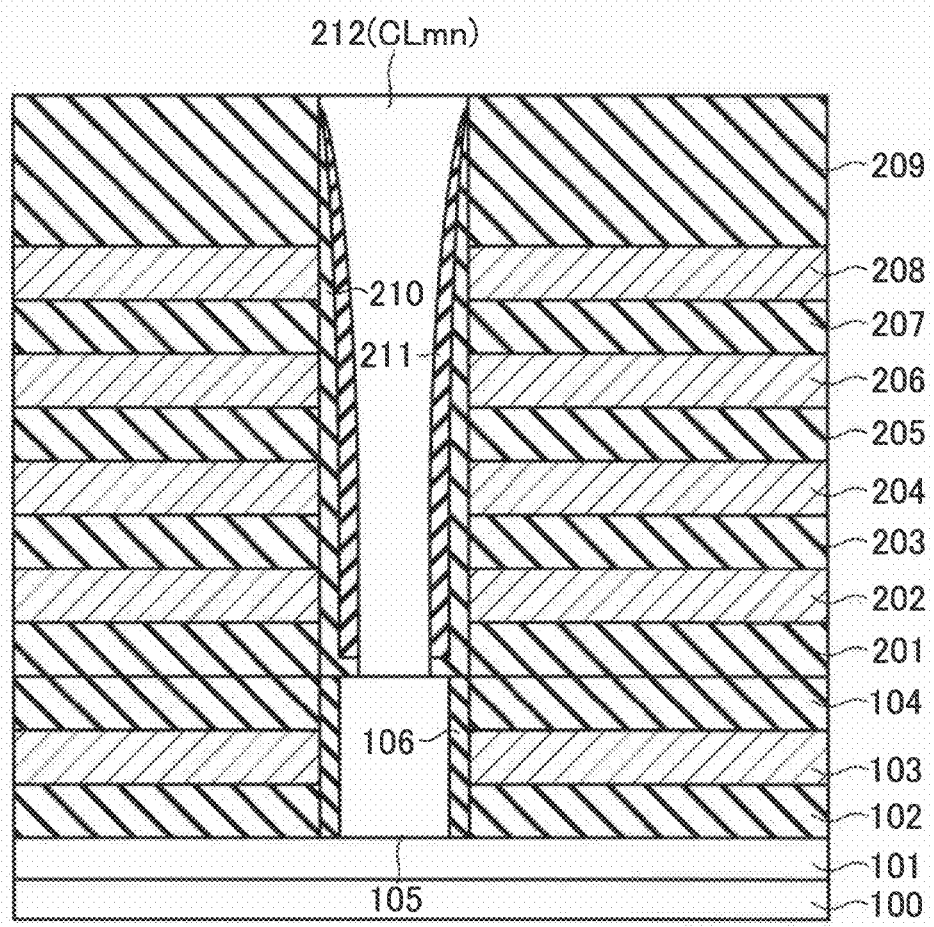
FIG. 13 is a cross-sectional view showing a process step of manufacturing the columnar semiconductor portion CLmn, the trap film 21 and the block insulator 22 in the nonvolatile semiconductor memory device 10 according to the first embodiment of the present invention.

Subsequently, as shown in FIG. 13, a wet etching (dilute HF process) is applied to remove the native oxide 105a and bury a polysilicon layer 212 in the penetrated hole H. The polysilicon layer 212 is to be turned into the columnar semiconductor portion CLmn. In a word, through the step in FIG. 13, the polysilicon layer 212 (columnar semiconductor portion CLmn) extending in the vertical direction from the semiconductor substrate Ba is formed adjacent to the silicon nitride (charge storage layer) 211 in the penetrated hole H.

Next, on the interlayer insulator 209 and the polysilicon layer 212, an interlayer insulator 213, a conductor (second conductor) 214 and an interlayer insulator 215 are deposited in turn. Then, a penetrated hole is formed from the interlayer insulator 213 to the polysilicon layer 212, and a polysilicon layer 217 is deposited in the penetrated hole with the inclusion of a gate insulator (first gate insulator) 216, leading to the state shown in FIG. 14. The polysilicon layer 217 is turned into the columnar semiconductor portion CLmn and the conductor 214 is turned into the drain-side selection gate line SGD. Then, a conductor 218 is formed on the polysilicon layer 217 (columnar semiconductor portion CLmn). The conductor 218 is turned into the bit line BL.

As described above, the nonvolatile semiconductor memory device according to the first embodiment has a structure including the memory transistors MTr1mn-MTr4mn (memory cells) stacked in layers three-dimensionally. The nonvolatile semiconductor memory device according to the first embodiment includes the trap film 21 formed adjacent to the columnar semiconductor portion CLmn and operative to serve as a charge storage layer. The trap film 21 is composed of a silicon nitride. The silicon nitride has a higher selectivity for a wet etching (dilute HF process) than the silicon oxide has. Therefore, on removal of the native oxide 105a on the polysilicon layer (columnar semiconductor portion CLmn) 105 by wet etching, the trap film 21 is not damaged. In a word, the present embodiment requires no additional film serving as a spacer on the trap film 21 on the side of the penetrated hole H. This is effective to reduce process steps to provide nonvolatile semiconductor memory devices at lower prices.

Figure 16:
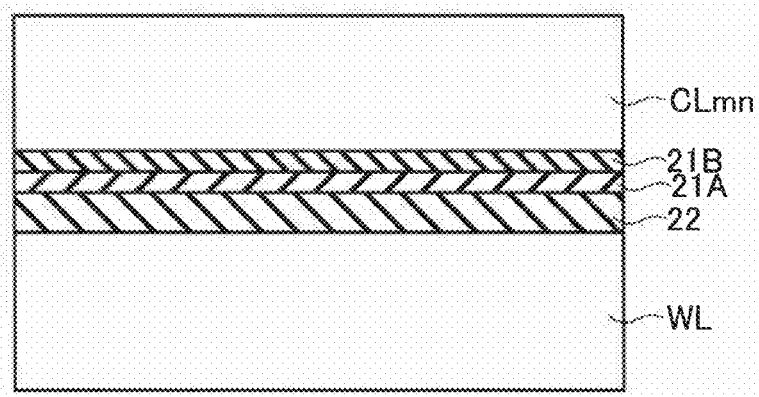
FIG. 16 is a conceptual view showing a structure of layers between a columnar semiconductor portion CLmn and a word line WL according to an alternative of the first embodiment of the present invention.

The trap film (charge storage layer) 21 according to the first embodiment may be formed of two different trap films 21A, 21B stacked as shown in FIG. 16. Namely, the first trap film 21A having a higher density of charge accumulative energy levels may be provided on the block insulator 22, and the second trap film 21B having a lower density of charge accumulative energy levels may be provided on the first trap film 21A. The first trap film 21A may be composed of a disilicon hexachloride ($Si_2Cl_6$) or a silicon-rich silicon nitride. In accordance with such the configuration, the nonvolatile semiconductor memory device according to the first embodiment can achieve a faster write characteristic with the structure of the first trap film 21A and the second trap film 21B. It also has a sufficiently higher retention, which can suppress the vanishment of data due to the release of charge. For example, the MONS-structured memory transistor MTrmn according to the first embodiment has a higher retention than the MONOS structure.

Second Embodiment

Configuration of Second Embodiment

Figure 17:
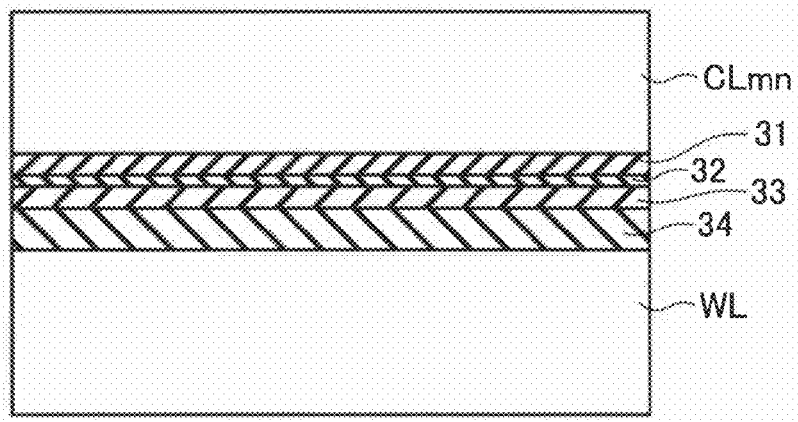
FIG. 17 is a conceptual view showing a structure of layers between a columnar semiconductor portion CLmn and a word line WL in a second embodiment of the present invention.

Referring next to FIG. 17, a nonvolatile semiconductor memory device according to a second embodiment of the present invention is described. As shown in FIG. 17, the nonvolatile semiconductor memory device according to the second embodiment differs from the first embodiment in layers formed between the columnar semiconductor portion CLmn and the word line WL. The parts in the second embodiment similar to those in the first embodiment are denoted with the same reference numerals and omitted from the following description.

As shown in FIG. 17, between the columnar semiconductor portion CLmn and the word line WL, a top insulator 31, a barrier insulator 32, a trap film 33 serving as a charge storage layer and a block insulator 34 are formed in turn from the columnar semiconductor portion CLmn toward the word line WL. In other words, they are configured such that the top insulator 31 adjoins the columnar semiconductor portion CLmn, the barrier insulator 32 adjoins the top insulator 31, the trap film 33 adjoins the barrier insulator 32, and the block insulator 34 adjoins the trap film 33. The top insulator 31 and the trap film 33 are composed of a silicon nitride (SiN) and the barrier insulator 32 and the block insulator 34 are composed of a silicon oxide ($SiO_2$). In a word, the memory transistor MTrmn has a SONONS structure (Semiconductor-Oxide-Nitride-Oxide-Nitride-Semiconductor), which includes Conductor, $SiO_2$, SiN, $SiO_2$, SiN and Semiconductor formed in turn from the word line WL to the columnar semiconductor portion CLmn. The barrier insulator 32 is formed 2 nm thick or less.

Figure 18:
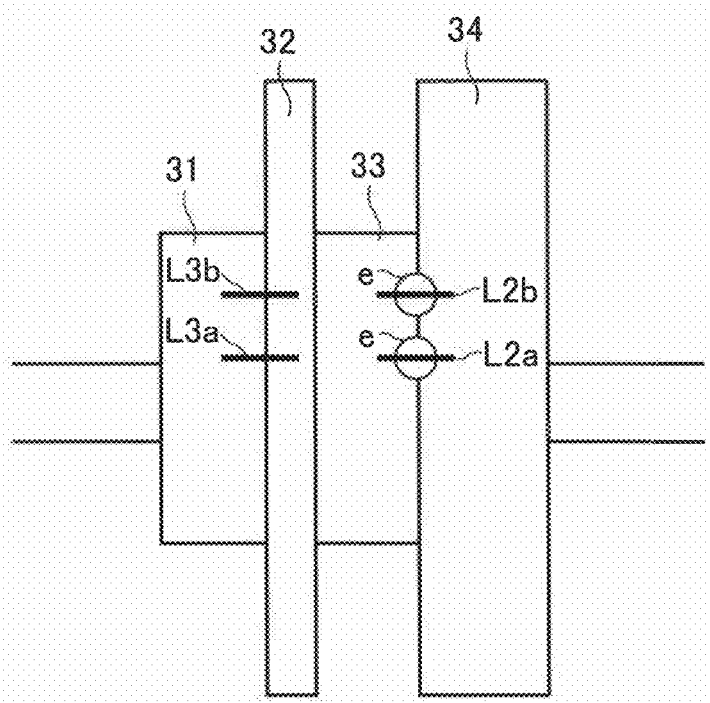
FIG. 18 briefly shows energy bands caused by a top insulator 31, a barrier insulator 32, a trap film 33 and a block insulator 34 in the second embodiment of the present invention.

FIG. 18 briefly shows energy bands caused by the top insulator 31, the barrier insulator 32, the trap film 33 and the block insulator 34 in the second embodiment. Charge e is accumulated (trapped) in energy levels L2a, L2b at the interface between the trap film (SiN) 33 and the block insulator ($SiO_2$) 34. There are also caused energy levels L3a, L3b at the interface between the top insulator 31 and the barrier insulator 32, and charge e is accumulated in the energy levels L3a, L3b. The top insulator 31 can be so thinned as to release the accumulated charge e in a short time.

(Method of Manufacturing Columnar Semiconductor Portion CLmn and Charge Storage Layer 30 in Configuration of Second Embodiment)

Figure 19:
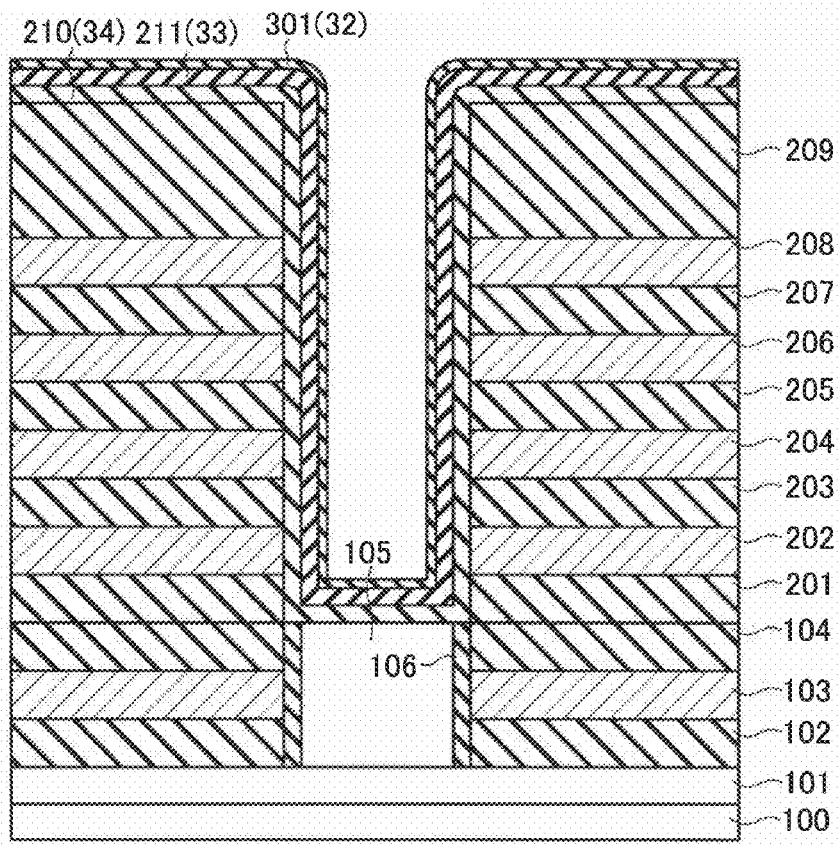
FIG. 19 is a cross-sectional view showing a process step of manufacturing the columnar semiconductor portion CLmn, the top insulator 31, the barrier insulator 32, the trap film 33 and the block insulator 34 in the nonvolatile semiconductor memory device 10 according to the second embodiment of the present invention.
Figure 20:
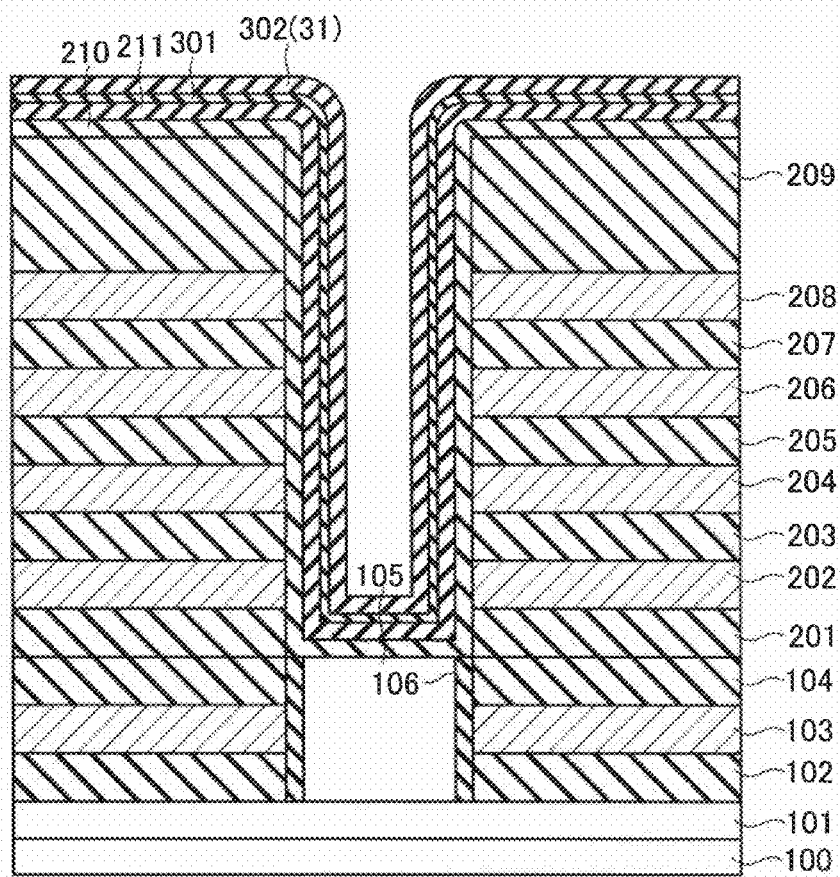
FIG. 20 is a cross-sectional view showing a process step of manufacturing the columnar semiconductor portion CLmn, the top insulator 31, the barrier insulator 32, the trap film 33 and the block insulator 34 in the nonvolatile semiconductor memory device 10 according to the second embodiment of the present invention.
Figure 21:
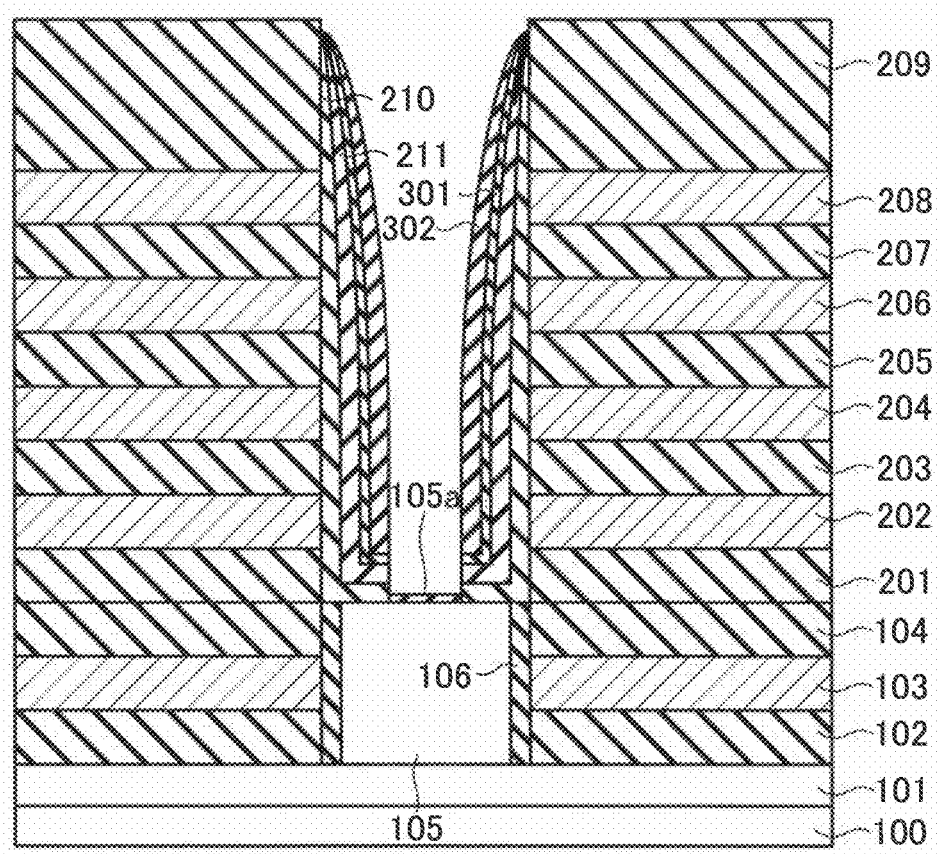
FIG. 21 is a cross-sectional view showing a process step of manufacturing the columnar semiconductor portion CLmn, the top insulator 31, the barrier insulator 32, the trap film 33 and the block insulator 34 in the nonvolatile semiconductor memory device 10 according to the second embodiment of the present invention.

Referring next to FIGS. 19-21, a method of manufacturing the columnar semiconductor portion CLmn, the top insulator 31, the barrier insulator 32, the trap film 33 and the block insulator 34 in the nonvolatile semiconductor memory device according to the second embodiment is described. The method of manufacturing in the second embodiment firstly comprises similar process steps to those of the first embodiment shown in FIGS. 7-10.

Following the step of the first embodiment shown in FIG. 10, a TEOS film 301 is deposited as shown in FIG. 19, and subsequently defy-annealing is applied to deposit a silicon nitride 302 as shown in FIG. 20. The TEOS film 301 is to be turned into the barrier insulator 32, which is controlled to have a thickness of 2 nm or less, for example. The barrier insulator 32 is not limited to the TEOS film 301 but may be the silicon nitride 211 directly oxidized through, for example, ISSG (In Situ Stream Generation) oxidation. The silicon nitride 302 is to be turned into the top insulator 31. In the second embodiment, the TEOS film 210 is to be turned into the block insulator 34 and the silicon nitride 211 into the trap film 33.

Thereafter, like the first embodiment, a RIE process is applied to remove the silicon nitride 302, the TEOS film 301, the silicon nitride 211 and the TEOS film 210 on the bottom of the penetrated hole H as shown in FIG. 21. Thus, the native oxide 105a is formed on the polysilicon layer 105.

Through the steps in FIGS. 19-21, the TEOS film 210 (block insulator 34) is formed on sides of the conductors 202, 204, 206, 208 facing the penetrated hole H. In addition, the silicon nitride 211 (trap film 33) is formed adjacent to sides of the TEOS film 210 (block insulator 34). Additionally, the TEOS film 301 (barrier insulator 32) is formed adjacent to sides of the silicon nitride 211 (trap film 33). Further, the silicon nitride 302 (top insulator 31) is formed adjacent to sides of the TEOS film 301 (barrier insulator 32).

Figure 14:
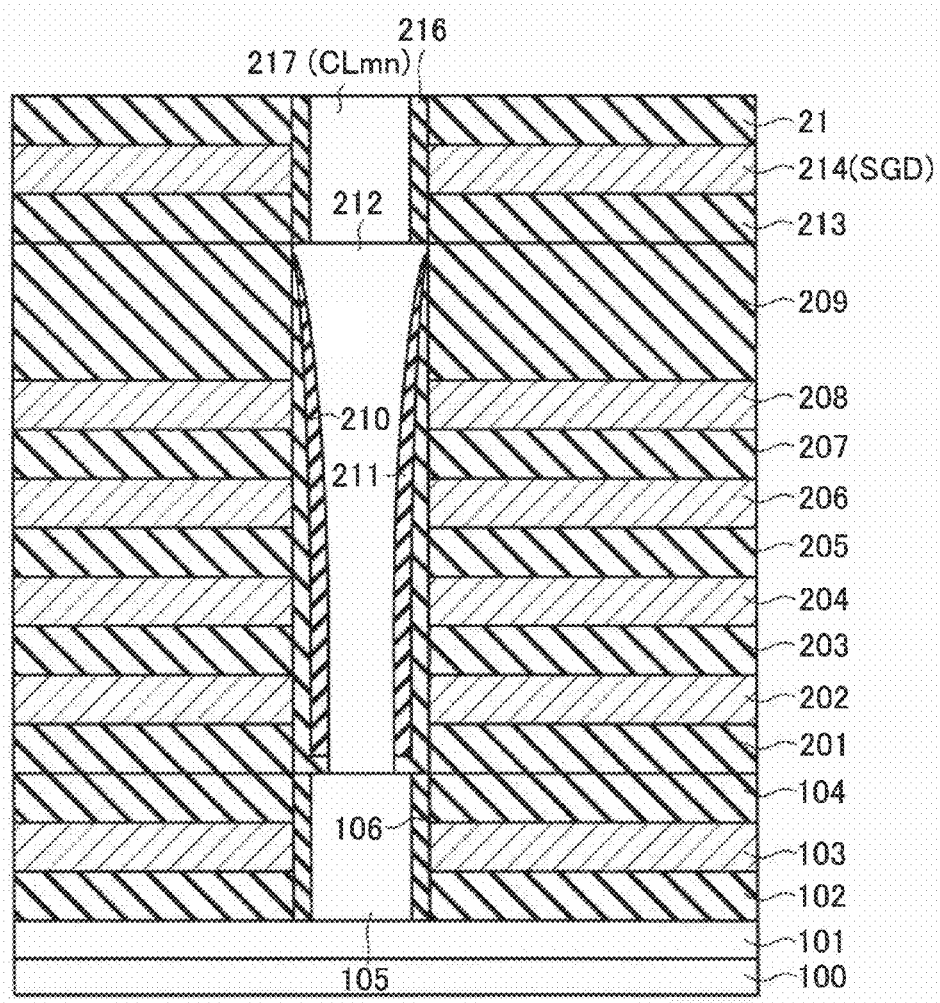
FIG. 14 is a cross-sectional view showing a process step of manufacturing the columnar semiconductor portion CLmn, the trap film 21 and the block insulator 22 in the nonvolatile semiconductor memory device 10 according to the first embodiment of the present invention.
Figure 15:
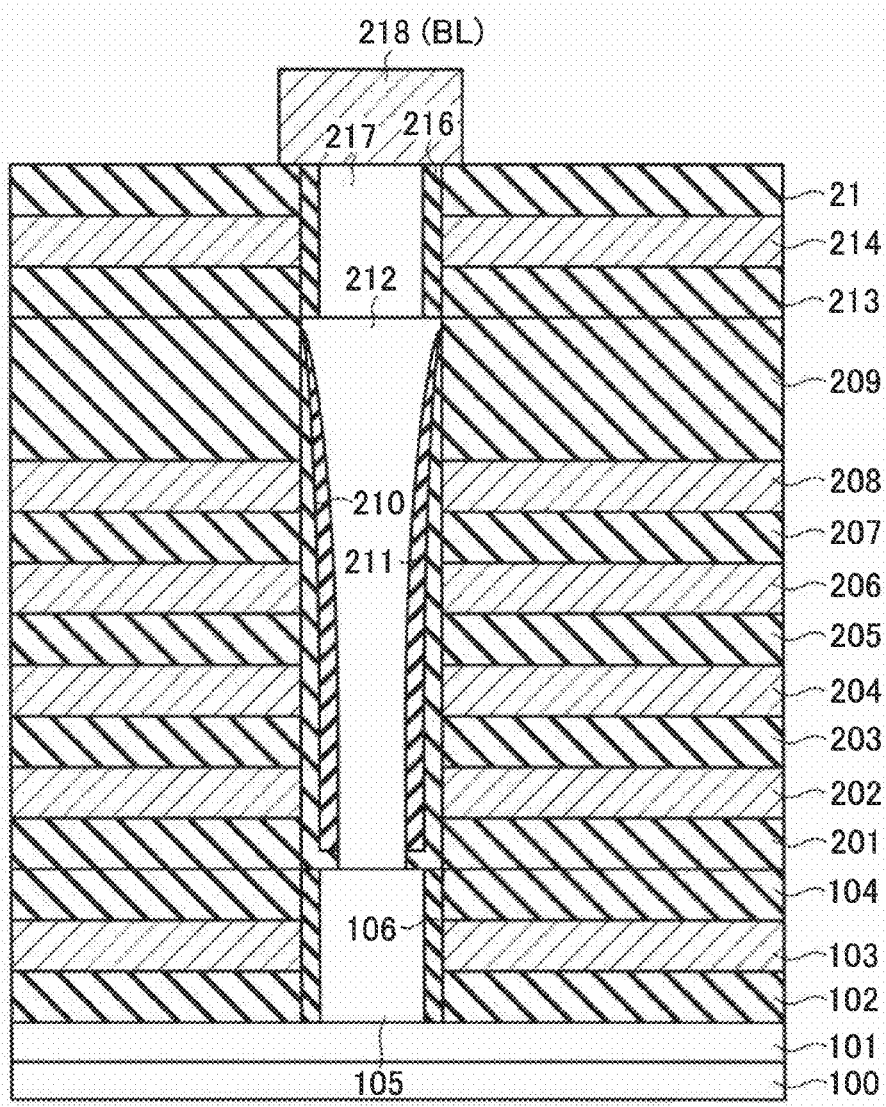
FIG. 15 is a cross-sectional view showing a process step of manufacturing the columnar semiconductor portion CLmn, the trap film 21 and the block insulator 22 in the nonvolatile semiconductor memory device 10 according to the first embodiment of the present invention.

Following FIG. 21, similar processes to those of the first embodiment shown in FIG. 13-15 are applied to manufacture the nonvolatile semiconductor memory device according to the second embodiment. Through similar processes to those of the first embodiment shown in FIG. 13-15, the columnar semiconductor portion CLmn extending in the vertical direction from the semiconductor substrate Ba is formed adjacent to sides of the silicon nitride 302 (top insulator 31) in the penetrated hole H.

As described above, the nonvolatile semiconductor memory device according to the second embodiment includes the top insulator 31 composed of a silicon nitride adjacent to the columnar semiconductor portion CLmn and accordingly can exert the same effect as that of the first embodiment. In the second embodiment, the silicon nitride used as the trap film 33 is desirably composed of a particular material that can cause many charge accumulative energy levels. In addition, the silicon nitride used as the top film 31 is desirably composed of a particular material that can cause no charge accumulative energy level.

Third Embodiment

Configuration of Third Embodiment

Figure 22:
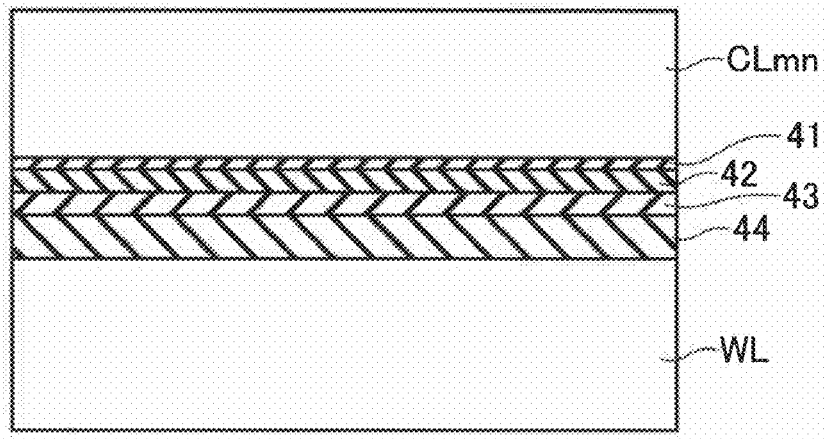
FIG. 22 is a conceptual view showing a structure of layers between a columnar semiconductor portion CLmn and a word line WL in a third embodiment of the present invention.
Figure 23:
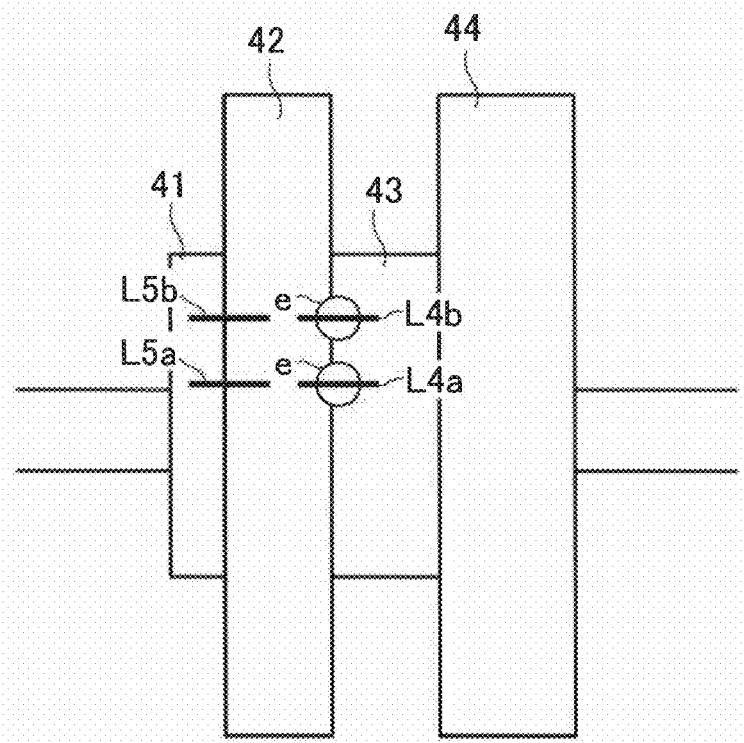
FIG. 23 briefly shows energy bands caused by a top insulator 41, a barrier insulator 42, a trap film 43 and a block insulator 44 in a nonvolatile semiconductor memory device 10 according to the third embodiment.

Referring next to FIGS. 22 and 23, a nonvolatile semiconductor memory device according to a third embodiment of the present invention is described. As shown in FIGS. 22 and 23, the nonvolatile semiconductor memory device according to the third embodiment differs from the first and second embodiments in layers formed between the columnar semiconductor portion CLmn and the word line WL. The parts in the third embodiment similar to those in the first and second embodiments are denoted with the same reference numerals and omitted from the following description.

As shown in FIG. 22, between the columnar semiconductor portion CLmn and the word line WL, a top insulator 41, a barrier insulator 42, a trap film 43 serving as a charge storage layer and a block insulator 44 are formed in turn from the columnar semiconductor portion CLmn toward the word line WL. In other words, they are configured such that the top insulator 41 adjoins the columnar semiconductor portion CLmn, the barrier insulator 42 adjoins the top insulator 41, the trap film 43 adjoins the barrier insulator 42, and the block insulator 44 adjoins the trap film 43. The top insulator 41 and the trap film 43 are composed of a silicon nitride (SiN) and the barrier insulator 42 is composed of a silicon oxide ($SiO_2$). The block insulator 44 is composed of a high-permittivity material, for example, a high-K insulator such as an alumina oxide ($Al_2O_3$). The top insulator 41 is formed 2 nm thick or less. On the other hand, the barrier insulator 42 is formed thicker than the top insulator 41 through ISSG (In Situ Stream Generation) oxidation comprising wet oxidation under reduced pressure. The barrier insulator 42 is not limited to one formed through ISSG oxidation but may be a TEOS film.

FIG. 23 briefly shows energy bands caused by the top insulator 41, the barrier insulator 42, the trap film 43 and the block insulator 44 in the third embodiment. Charge e is accumulated (trapped) in energy levels L4a, L4b at the interface between the barrier insulator ($SiO_2$) 42 and the trap film (SiN) 43. There are also caused energy levels L5a, L5b at the interface between the top insulator 41 and the barrier insulator 42, and charge e is accumulated in the energy levels L5a, L5b. The top insulator 41 can be so thinned as to release the accumulated charge e in a short time.

A method of manufacturing the columnar semiconductor portion CLmn, the top insulator 41, the barrier insulator 42, the trap film 43 and the block insulator 44 in the third embodiment comprises almost similar process steps to those in the first and second embodiments. In a word, in the third embodiment, a high-permittivity insulator such as an alumina oxide may be formed in place of the TEOS film 210 shown in FIG. 10.

As described above, the method of manufacturing the nonvolatile semiconductor memory device according to the third embodiment includes the top insulator 41 composed of a silicon nitride adjacent to the columnar semiconductor portion CLmn and accordingly can exert the same effect as those of the first and second embodiments. The barrier insulator 42 is formed sufficiently thicker than the top insulator 41 and can enhance the retention.

One embodiment associated with the nonvolatile semiconductor memory device has been described above though the present invention is not limited to the above embodiment. For example, the above-described trap film 43 (21) and the top insulator 41 are not limited to the silicon nitride. For example, the top insulator 41 may be one that has a higher selectivity to the silicon oxide under certain condition. In addition, the trap film 43 (21) may be one that has a higher selectivity to the silicon oxide under certain condition and serves as a charge storage layer. The above-described trap film 43 (21) and the top insulator 41 may be composed of a hafnium aluminate (HfAlO).

What is claimed is:

1. A nonvolatile semiconductor memory device having a plurality of memory strings each including a plurality of electrically rewritable memory cells serially connected, said memory string including
    a columnar semiconductor portion extending in the vertical direction from a substrate,
    a first charge storage layer formed adjacent to and in direct contact with said columnar semiconductor portion and configured to accumulate charge,
    a first block insulator formed adjacent to said first charge storage layer, and
    a first conductor formed adjacent to said first block insulator.

2. The nonvolatile semiconductor memory device according to claim 1, wherein said first charge storage layer is composed of a silicon nitride,
    wherein said first block insulator is composed of a silicon oxide.

3. The nonvolatile semiconductor memory device according to claim 1, wherein said first charge storage layer is configured to contain a disilicon hexachloride,
    wherein said first block insulator is composed of a silicon oxide.

4. The nonvolatile semiconductor memory device according to claim 1, wherein said first charge storage layer is composed of a hafnium aluminate,
    wherein said first block insulator is composed of a silicon oxide.

5. The nonvolatile semiconductor memory device according to claim 1, wherein said memory string further includes
    a first gate insulator formed adjacent to said columnar semiconductor portion and located above said first charge storage layer, and
    a second conductor formed adjacent to said first gate insulator and located above said first conductor,
    wherein said second conductor serves as a control gate of a first selection transistor operative to control the current flow in said memory cell.

6. The nonvolatile semiconductor memory device according to claim 1, wherein said memory string further includes
    a second gate insulator formed adjacent to said columnar semiconductor portion and located beneath said first charge storage layer, and
    a third conductor formed adjacent to said second gate insulator and located beneath said first conductor,
    wherein said third conductor serves as a control gate of a second selection transistor operative to control the current flow in said memory cell.

7. A nonvolatile semiconductor memory device having a plurality of memory strings each including a plurality of electrically rewritable memory cells serially connected, said memory string including
    a columnar semiconductor portion extending in the vertical direction from a substrate,
    a top insulator formed adjacent to said columnar semiconductor portion,
    a barrier insulator formed adjacent to said top insulator,
    a first charge storage layer formed adjacent to said barrier insulator and configured to accumulate charge,
    a first block insulator formed adjacent to said first charge storage layer, and
    a first conductor formed adjacent to said first block insulator.

8. The nonvolatile semiconductor memory device according to claim 7, wherein said top insulator and said first charge storage layer are composed of a silicon nitride,
    wherein said barrier insulator and said first block insulator are composed of a silicon oxide.

9. The nonvolatile semiconductor memory device according to claim 7, wherein said top insulator and said first charge storage layer are composed of a silicon nitride,
    wherein said barrier insulator is composed of a silicon oxide,
    wherein said first block insulator is composed of a high-K insulator.

10. The nonvolatile semiconductor memory device according to claim 7, wherein said top insulator and said first charge storage layer are composed of a hafnium aluminate,
    wherein said barrier insulator is composed of a silicon oxide,
    wherein said first block insulator is composed of a high-K insulator.

11. The nonvolatile semiconductor memory device according to claim 7, wherein said memory string further includes
    a first gate insulator formed adjacent to said columnar semiconductor portion and located above said first charge storage layer, and
    a second conductor formed adjacent to said first gate insulator and located above said first conductor,
    wherein said second conductor serves as a control gate of a first selection transistor operative to control the current flow in said memory cell.

12. The nonvolatile semiconductor memory device according to claim 7, wherein said memory string further includes
    a second gate insulator formed adjacent to said columnar semiconductor portion and located beneath said first charge storage layer, and
    a third conductor formed adjacent to said second gate insulator and located beneath said first conductor,
    wherein said third conductor serves as a control gate of a second selection transistor operative to control the current flow in said memory cell.

* * * * *